(12) United States Patent
Schwindt et al.

(10) Patent No.: US 9,995,800 B1
(45) Date of Patent: Jun. 12, 2018

(54) ATOMIC MAGNETOMETER WITH MULTIPLE SPATIAL CHANNELS

(71) Applicant: NATIONAL TECHNOLOGY & ENGINEERING SOLUTIONS OF SANDIA, LLC, Albuquerque, NM (US)

(72) Inventors: Peter Schwindt, Albuquerque, NM (US); Cort N. Johnson, Arlington, MA (US); Yuan-Yu Jau, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 374 days.

(21) Appl. No.: 14/692,936

(22) Filed: Apr. 22, 2015

Related U.S. Application Data

(60) Provisional application No. 61/985,996, filed on Apr. 29, 2014.

(51) Int. Cl.
| | |
|---|---|
| *H03L 7/26* | (2006.01) |
| *G01R 33/26* | (2006.01) |
| *H01S 1/06* | (2006.01) |
| *G04F 5/14* | (2006.01) |
| *G01V 3/00* | (2006.01) |

(52) U.S. Cl.
CPC .............. *G01R 33/26* (2013.01); *G01V 3/00* (2013.01); *G04F 5/14* (2013.01); *H01S 1/06* (2013.01); *H03L 7/26* (2013.01)

(58) Field of Classification Search
CPC ... G01R 33/26; H03L 7/26; H01S 1/06; G04F 5/14; G01V 3/00

USPC .............................. 324/304, 301; 331/3, 94.1
See application file for complete search history.

(56) References Cited

U.S. PATENT DOCUMENTS

| | | |
|---|---|---|
| 6,472,869 B1 | 10/2002 | Upschulte et al. |
| 7,038,450 B2 | 5/2006 | Romalis et al. |
| 7,483,130 B2 | 1/2009 | Baumberg et al. |
| 7,489,134 B2 | 2/2009 | Reiderman |
| 7,521,928 B2 | 4/2009 | Romalis et al. |
| 7,826,065 B1 | 11/2010 | Okandan et al. |
| 8,212,556 B1 * | 7/2012 | Schwindt ............... G01R 33/26 324/301 |
| 2007/0152154 A1 * | 7/2007 | DeCamp ............... G01J 3/2803 250/339.07 |
| 2009/0039881 A1 | 2/2009 | Kitching et al. |
| 2009/0243610 A1 | 10/2009 | Ichihara et al. |
| 2010/0156419 A1 | 6/2010 | Sugioka |

(Continued)

OTHER PUBLICATIONS

Schwindt, P., "Towards a Multi-Channel Atomic Magnetometer Array for MEG", Sandia National Laboratories, 2014.

(Continued)

*Primary Examiner* — Arnold Kinkead
(74) *Attorney, Agent, or Firm* — Martin I. Finston

(57) ABSTRACT

An atomic magnetometer includes an atomic vapor cell, an optical system conformed to transmit pump radiation and probe radiation through the vapor cell, and an optical detection system arranged to receive and detect probe radiation after it exits the vapor cell. Improvements in the separation of spatial channels are achieved by using a a diffractive optical element arranged to divide at least the pump radiation into a plurality of separate diffracted beams that traverse the vapor cell.

11 Claims, 11 Drawing Sheets

(56) References Cited

U.S. PATENT DOCUMENTS

| | | |
|---|---|---|
| 2010/0308814 A1 | 12/2010 | Wu |
| 2011/0025323 A1 | 2/2011 | Budker et al. |
| 2011/0031969 A1 | 2/2011 | Kitching et al. |
| 2011/0193555 A1 | 8/2011 | Sugioka et al. |
| 2013/0278253 A1* | 10/2013 | Ichihara .......... G01R 33/26 324/304 |
| 2015/0042327 A1* | 2/2015 | Bulatowicz .......... G01R 33/26 324/301 |
| 2015/0377989 A1* | 12/2015 | Ben Amar Baranga .......... G01R 33/032 324/304 |

OTHER PUBLICATIONS

Schwindt, P., "A Cryogen-Free, Low-Cost Atomic Magnetometer Array for Magnetoencephalography", Research Report for Grant, 2014.

Johnson, C. et al, "A two-color pump probe atomic magnetometer for magnetoencephalography", IEEE International Frequency Control Symposium, 2010, pp. 371-375.

Johnson, C. et al, "Multi-sensor magnetoencephalography with atomic magnetometers", Physics in Medicine and Biology, 2013, vol. 58, pp. 6065-6077.

Xia, H. et al., "Magnetoencephalography with an atomic magnetometer", Applied Physics Letters, 2006, vol. 89, pp. 211104-1-2011104-3.

Sander, T. H. et al., "Magnetoencephalography with a chip-scale atomic magnetometer", Biomedical Optics Express, 2012, vol. 3, pp. 981-990.

Bison, G. et al., "A room temperature 19-channel magnetic field mapping device for cardiac signals", Applied Physics Letters, 2009, vol. 95, pp. 173701-1-173701-3.

Wyllie, R. et al., "Magnetocardiography with a modular spin-exchange relaxation free atomic magnetometer array", Physics in Medicine Biology, 2012, vol. 57, pp. 2619-2632.

Wyllie, R. et al., "Optical magnetometer array for fetal magnetocardiography", Optics Letters, 2012, vol. 37, pp. 2247-2249.

Knappe, S. et al., "Cross-validation of microfabricated atomic magnetometers with superconducting quantum interference devices for biomagnetic applications", Applied Physics Letters, 2010, vol. 97, pp. 133703-1-133703-3.

Johnson, C. et al., "Magnetic relaxometry with an atomic magnetometer and SQUID sensors on targeted cancer cells", Journal of Magnetism and Magnetic Materials, 2012, vol. 324, pp. 2613-2619.

Liebl, M. et al., "Spatial reconstruction of a magnetic nanoparticle distribution using a single sensor and multiple magnetizing coils", Biomed Tech, 2012, vol. 57.

Savukov, I. et al., "Detection of NMR signals with a radio-frequency atomic magnetometer", Journal of Magnetic Resonance, 2007, vol. 185, pp. 214-220.

Budker, D. et al., "Optical Magnetometry", Nature Physics, 2007, vol. 3, pp. 227-234.

Shah, V. et al., "Spin-exchange relaxation-free magnetometry using elliptically polarized light", Physical Review A, 2009, vol. 80, pp. 0131416-1-0131416-6.

Kominis, I.K. et al., "A subfemtotesla multichannel atomic magnetometer", Nature, vol. 422 (2003) pp. 596-599.

Schwindt, P.D.D. et al., "Self-oscillating rubidium magnetometer using nonlinear magneto-optical rotation", Review of Scientific Instruments, vol. 76 (2005), pp. 126103-1-126103-4.

Higbie, J.M. et al., "Robust, High-speed, All-Optical Atomic Magnetometer", Review of Scientific Instruments, vol. 77 (2006) pp. 113106-1-113106-7.

Shah, V., "Subpicotesla atomic magnetometry with a microfabricated vapour cell", Letteres, Nature Photonics, vol. 1 (2007), pp. 649-652.

Kim, K., "Multi-channel atomic magnetometer for magnetoencephalography: A configuration study", NeuroImage, vol. 89 (2014), pp. 143-151.

Kim, K., "Development of a retro-reflection brain atomic magnetometer system and MEG source localization", embc.embs.org/files/2013/1553_Fl.pdf.

* cited by examiner

ATOMIC MAGNETOMETER WITH MULTIPLE SPATIAL CHANNELS

CROSS-REFERENCE TO RELATED APPLICATION

This application claims priority to U.S. Provisional Patent Application No. 61/985,996, filed on Apr. 29, 2014 under the title, "Atomic Magnetometer with Multiple Spatial Channels," the entirety of which is incorporated herein by reference.

STATEMENT OF GOVERNMENT RIGHTS

This invention was developed under Grant No. R01EB013302 from the National Institute of Biomedical Imaging and Bioengineering of the National Institutes of Health and under Contract DE-AC04-94AL85000 between Sandia Corporation and the U.S. Department of Energy. The U.S. Government has certain rights in this invention.

FIELD OF THE INVENTION

The present invention relates in general to magnetometers, and in particular to atomic magnetometers which rely on optically polarizing an alkali metal vapor and optically probing the state of magnetization of the polarized alkali metal atoms to sense a magnetic field.

BACKGROUND OF THE INVENTION

High-sensitivity detection of magnetic fields is critical to many applications including ordinance detection, geophysical mapping, navigation, and the detection of bio-magnetic fields associated with heart and brain activity. Conventional superconducting magnetometers based on superconducting quantum interference devices (SQUIDs) provide a high sensitivity for magnetic field detection but are bulky and require expensive cryogenic cooling. Atomic magnetometers, which are based on optical measurements of unpaired electron spin in an alkali metal vapor are being developed. These atomic magnetometers do not require cryogenic cooling and are capable of measuring the absolute magnetic field at high sensitivity (down to less than one femtotesla).

U.S. Pat. No. 8,212,556 (hereinafter, the '556 patent), which is commonly owned herewith, issued to P. Schwindt and C. N. Johnson on Jul. 3, 2012 under the title, "Atomic Magnetometer". The entirety of the said '556 patent is hereby incorporated herein by reference. The '556 patent provided an atomic magnetometer in which a pump light beam and a probe light beam are directed in substantially the same direction through an alkali metal vapor cell. That arrangement was useful because, inter alia, it helped to reduce the lateral dimensions of the atomic magnetometer relative to other types of atomic magnetometers, and because it made it possible to sense magnetic fields at an arbitrary angle orthogonal an optical path of the pump and probe light beams. By contrast, other types of atomic magnetometers, in which the pump light beam is orthogonal to the probe light beam, are limited to sensing a magnetic field in a single direction.

The magnetometer of the '556 patent also utilized two different wavelengths for the pump and probe light beams. This arrangement allowed the pump light beam to be blocked with an optical filter while allowing the probe light beam to be transmitted through the optical filter and subsequently detected as a way to sense the magnetic field. The pump and probe beams were deliverable by either free-space or fiber optic transport. Hence the lasers used to generate the pump and probe light beams could be located at a distance from the atomic magnetometer.

The use of fiber optic delivery, in particular, was advantageous because it allowed a plurality of atomic magnetometers to be supplied with pump and probe light beams from a single pair of lasers in an arrangement in which the pump and probe light beams are respectively split and separately sent through optical fibers to each magnetometer.

In implementations described in the '556 patent, the vapor cell contains an alkali metal vapor (e.g. sodium, potassium, rubidium or cesium). The pump beam, which has a wavelength substantially equal to the wavelength of a first D-line atomic transition of the alkali metal vapor, is directed through the vapor cell to magnetically polarize the alkali metal vapor. Before entering the vapor cell, the pump beam, which is initially linearly polarized, is directed through a wave plate to convert it to circular polarization.

The probe beam, which is linearly polarized and which has a wavelength substantially equal to the wavelength of a second D-line atomic transition of the alkali metal vapor, is also directed through the vapor cell, where it undergoes a change in polarization due to a magnetic interaction with the polarized atomic vapor. Prior to entry into the vapor cell, the probe beam also passes through the wave plate, but the wave plate is dimensioned so as to operate as a quarter-wave plate at the pump wavelength and as a half-wave plate at the probe wavelength. Hence the effect of the wave plate on the probe beam is only to rotate its direction of linear polarization.

An optical filter that is located in the exit path of the pump and probe beams blocks the pump beam, permitting only the probe beam to impinge a photodetection system. The photodetection system comprises a differential pair of photodetectors onto which the exiting probe beam is directed by a polarization beam splitter. The photodetection system responds by generating an electric signal indicative of the change in polarization of the probe beam.

Useful information can be provided even by single-element photodetectors. However, as explained in the '556 patent, multi-element photodetectors can advantageously provide spatial discrimination by sensing the magnetic field at various locations within the vapor cell. In that regard, each individual photodetector element provides a respective spatial channel for sensing a respective portion of the volume within the vapor cell.

In practical implementations, we pumped and probed the vapor cell with a Gaussian beam having a relatively large full width at half maximum (FWHM) of about 15 mm. We made a four-channel magnetometer by impinging the exiting beam onto a pair of four-quadrant photodetectors. With this approach, we were able to achieve a spatial channel separation of about 5 mm.

Although the spatial resolution provided by such an approach is useful, an even greater range of applicability could be gained by further increases in the channel separation. Hence there remains a need for further advances that increase the separation between the spatial channels.

SUMMARY OF THE INVENTION

We have made such an advance. In our new approach, a diffractive optical element (DOE) operates on the incoming beam to create a plurality of individual beams so that a multichannel magnetometer is defined within a single vapor cell. Through appropriate design of the DOE, a wide range of channel separations is achievable, as well as flexible numbers and arrangements of the respective beams. We have also developed a compact magnetic imaging device using the multichannel magnetometer.

DETAILED DESCRIPTION

Figure 1:
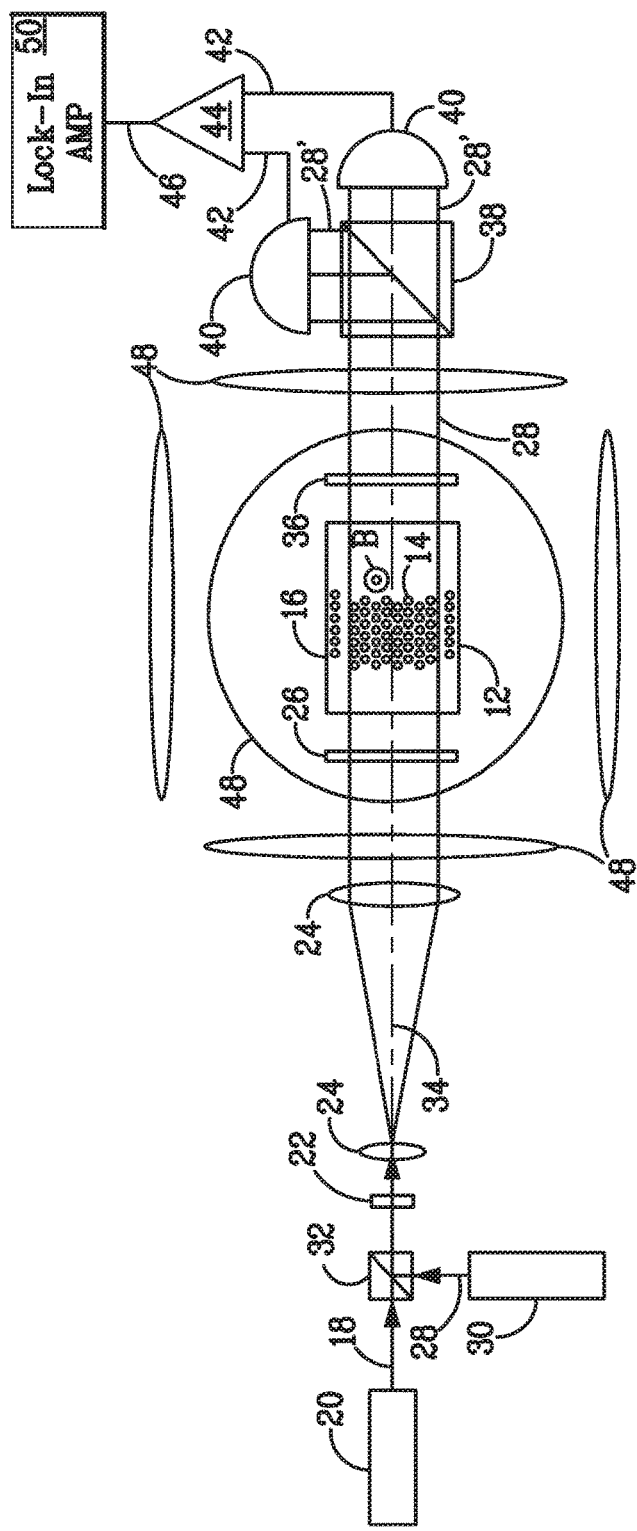
FIG. 1 shows a schematic plan view of a first example of an atomic magnetometer of the prior art for sensing a magnetic field according to a description in the '556 patent.

Before embarking on a detailed discussion, we will first briefly summarize the design and operative principles of an atomic magnetometer (AM) that is described here for illustration only and not for purposes of limitation. The AM senses magnetic fields by interrogating the interaction of the electronic spins of alkali atoms contained within a glass vapor cell with a magnetic field using a near-resonant laser field. The magnetic response of a rubidium atomic vapor is maximized by passing a circularly polarized pump laser beam through the vapor to align nearly all of the electron spins. Such optical pumping greatly enhances the sensitivity because the signals from all the atoms add coherently. The collective response of the atoms to the magnetic field results in a change in the index of refraction of the atomic gas, which is measured by detecting the optical rotation of a linearly polarized probe laser beam. This scheme can be used to measure sample-originating magnetic field components that are perpendicular to the optical axis of the magnetometer, i.e. to the direction in which the pump and probe beams propagate through the vapor cell.

It should be noted that although distinct pump and probe beams are used in our example, other implementations can use the same beam and the same wavelength for both pumping and probing the atomic vapor. In such implementations, the amount of light that is transmitted through the vapor cell is the directly measured quantity that provides the magnetic field measurement. This is in contrast to the measurement of polarization rotation that indicates the magnetic field strength when separate pump and probe beams are used.

The example utilizes the atomic fine structure of rubidium. A pump laser pumps the atoms with the rubidium D1 line at 795 nm and a probe laser probes the atoms with the rubidium D2 line at 780 nm. The polarizations of the pump and probe beams are controlled by a dichroic waveplate which is dimensioned so as to convert the D1 light, which is initially linearly polarized, into a circularly polarized beam while maintaining the linear polarization of the D2 probe light.

After the pump and probe beams have transilluminated, i.e. propagated through, the vapor cell, changes in the angle of polarization of the probe beam are measured by directing the probe light into a polarization analyzer and from there to paired photodetectors for balanced detection. Prior to detection, the pump light is removed from the detected beam by an optical line filter.

Due to the symmetry of the system when the pump and probe beams propagate collinearly, the AM is insensitive to near-zero static magnetic fields. However, levels of sensitivity useful for magnetoencephalography and other biomedical applications can be achieved by applying a modulated magnetic field to the vapor cell and using phase-sensitive detection on the photodetector outputs. For that purpose, field coils surrounding the vapor cell are driven with, e.g., a sinusoidal current at a frequency of about 1 kHz.

Significantly, the magnetometer will be made sensitive in this manner only to sample-originating field components that are simultaneously perpendicular to the optical axis of the magnetometer and parallel to the direction of the modulated field. Thus, by providing and controlling mutually perpendicular sets of field coils, it is possible to select the field component that is to be detected.

Those skilled in the art will recognize that the magnetic field of a small dipolar source, as might be expected in many biomedical samples, falls off as the inverse cube of the distance to the detector. This militates for placing the vapor cell as close to the sample as possible. A folded optical geometry, in which the laser beams are reflected back on a second pass through the vapor cell and thence to the photodetectors, facilitates such close placement.

Turning now to the figures, there will be seen in FIG. 1 a schematic diagram of a first example of an atomic magnetometer 10 for sensing a magnetic field according to a description in the '556 patent. This apparatus 10, which is also referred to herein as a magnetometer 10, comprises a cell 12 containing an alkali metal vapor 14. The cell 12, which can be made of glass, can also include a buffer gas 16 comprising, e.g., a noble gas such as helium or neon. Another gas such as nitrogen can also be added to the buffer gas 16. The cell 12 can be heated to an elevated temperature to provide a density of alkali metal atoms in the vapor 14 which can range from about $10^{11}$ cm$^{-3}$ to $10^{15}$ cm$^{-3}$ or more.

The exact temperature to which the cell 12 is heated will depend, in general, upon the alkali metal (e.g. sodium, potassium, rubidium, or cesium) which is used in the apparatus 10. As an example, when the alkali metal comprises rubidium-87, the cell 12 can be heated up to about 200° C. The cell 12 is typically heated by locating the cell 12 within an oven (see FIG. 3). The oven has been omitted from FIG. 1 to better show other details of the atomic magnetometer 10.

In the atomic magnetometer 10, a pump light beam 18, which can be generated by a laser 20 is directed through a linear polarizer 22 to linearly polarize the pump light beam 18. The linear polarizer 22 can be omitted if the pump light beam 18 is already linearly polarized by the laser 20. The pump light beam 18, which can have an optical power level of up to a few milliWatts (mW) or more depending upon the size of the cell 12, can then be expanded and substantially collimated by one or more lenses 24. The pump light beam 18 can be expanded, for example, to a size which fills a majority of the internal volume of the cell 12. The lateral dimensions of cell 12 are typically about 25 mm or smaller, but could also be substantially greater than 25 mm.

After being expanded and substantially collimated by the lenses 24, the pump light beam 18 in FIG. 1 is directed through an optical waveplate 26 having a fast axis which is oriented at 45° to a direction (e.g. vertical out of the plane of FIG. 1 or horizontal in the plane of FIG. 1) of the linear polarization of the pump light beam 18. After being transmitted through the optical waveplate 26, the pump light beam 18 is directed through the cell 12 containing the alkali metal vapor 14. (The placement of the waveplate as described here is merely exemplary. The waveplate could be placed anywhere between the point where the pump and probe beams are combined and the point where the beams enter the vapor cell.)

The optical waveplate 26 functions as a quarter waveplate at the wavelength of the pump light beam 18, which is substantially equal to the wavelength of a first D-line atomic transition of the alkali metal vapor 14. In this way, the optical waveplate 26 converts the pump light beam 18, which was initially linearly polarized, to circular polarization. The circularly-polarized light in the beam 18 after passing through the optical waveplate 26 can have either right-handed or left-handed circular polarization.

The first D-line atomic transition of the pump light beam 18 can be either a D1 atomic transition (also referred to herein as a D1 transition or a D1 line) defined herein as a transition from a n$^2$S$_{1/2}$ ground state to a m$^2$P$_{1/2}$ excited state of the alkali metal atoms in the vapor 14 where n and m are integers, or a D2 atomic transition (also referred to herein as a D2 transition or a D2 line) defined herein as a transition from a n$^2$S$_{1/2}$ ground state to a m$^2$P$_{3/2}$ excited state of the alkali metal atoms in the vapor 14 where n and m are integers.

The wavelengths in nanometers of the lowest-lying (D1, D2) transitions for various alkali metals are: Sodium (590, 589); Potassium (770 767); Rubidium (795, 780); Cesium (894; 852).

Figure 2:
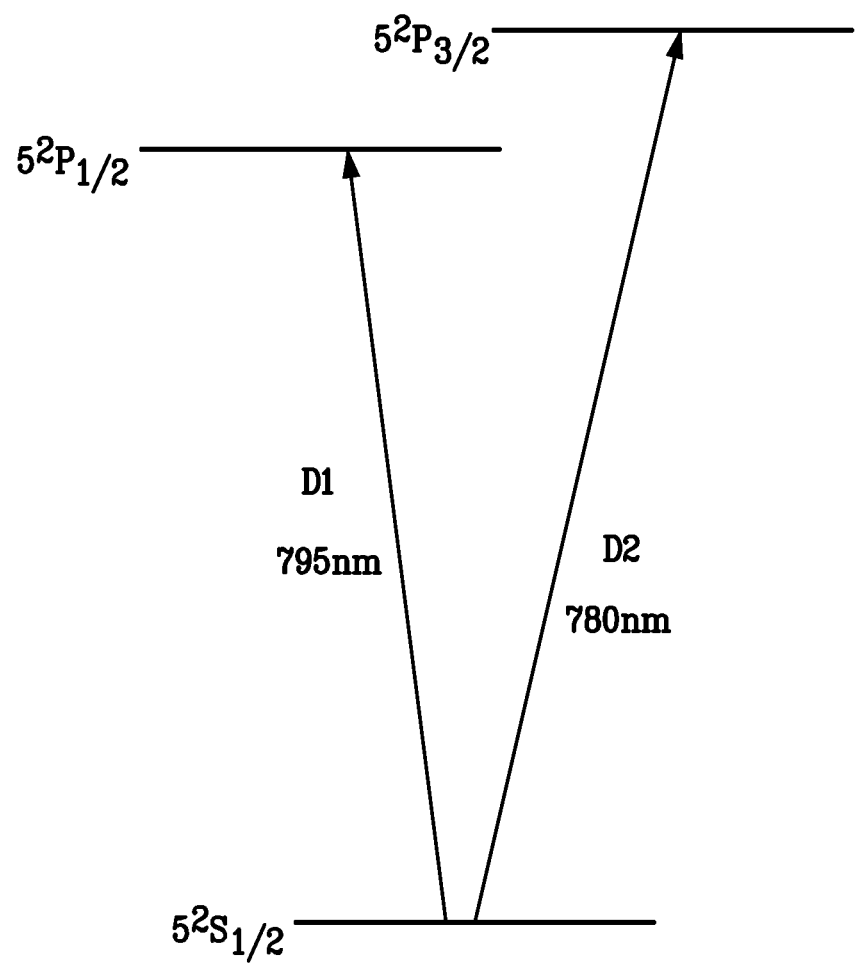
FIG. 2 is an energy-level diagram for rubidium-87 showing the D1 transition from the $5^2S_{1/2}$ ground state to the $5^2P_{1/2}$ excited state and the D2 transition from the $5^2S_{1/2}$ ground state to the $5^2P_{3/2}$ excited state.

FIG. 2 provides, by way of illustration, an energy-level diagram for rubidium-87 showing the D1 transition from the $5^2$S$_{1/2}$ ground state to the $5^2$P$_{1/2}$ excited state and the D2 transition from the $5^2$S$_{1/2}$ ground state to the $5^2$P$_{3/2}$ excited state.

The spectral lines corresponding to the D1 and D2 transitions have Voigt line shapes (which approach Lorentzian lineshapes at high buffer gas pressure). For each line, the full-width-at-half-maximum (FWHM) can range up to 10-20 GHz due to pressure broadening by the buffer gas. The pump light beam 18 need not be tuned to the exact center of the D1 or D2 spectral line, but instead can be tuned off-center toward the wings of the spectral line by a fraction of a nanometer, that is by up to several tens of gigahertz. Such detuning can be useful to reduce the absorption of the pump light beam 18 by the alkali metal vapor 14, thereby allowing the pump light beam 18 to be transmitted through the cell 12, or in some cases, allowing the pump light beam 18 to pass through the cell 12 more than once (e.g. when a folded optical path is used).

Similarly, a probe light beam 28 used in the atomic magnetometer 10 does not need to be tuned exactly to the center of the D2 or D1 spectral line, but can be tuned off-center by up to several hundred gigahertz.

As used herein, the term "substantially equal to the wavelength of a D-line transition" means that the pump or probe light beam has a wavelength which is sufficiently near to the D1 or D2 transition so that there is an interaction between the pump or probe light beam 18 or 28, respectively, and the alkali metal vapor 14. In the case of the pump light beam 18, this interaction results in absorption of at least some of the energy in the pump light beam 18 by the alkali metal vapor 14. In the case of the probe light beam 28, this interaction results in a change in an index of refraction of the alkali metal vapor 14, which produces an angular rotation in the direction of the linear polarization of the probe light beam 28 (also termed a Faraday rotation).

The circular polarization of the pump light beam 18 produced by the optical waveplate 26 is used to align the spins of the individual alkali metal atoms in the alkali metal vapor 14. This can be understood with reference to FIGS. 3-5.

Figure 3:
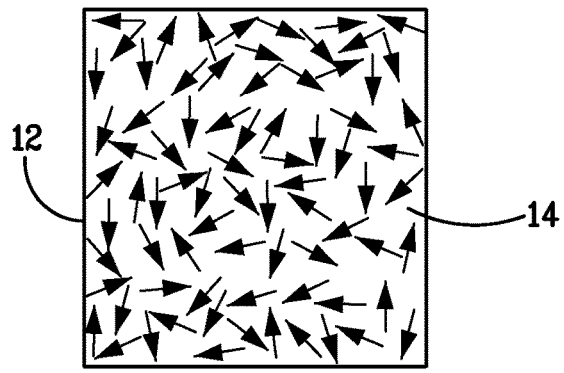
FIG. 3 schematically illustrates an initial random alignment of the spins of the alkali metal atoms in the cell of the atomic magnetometer of FIG. 1, with an axis of the spins of the alkali metal atoms being indicated by the arrows.

In FIG. 3, each alkali metal atom in the vapor 14 in the cell 12 initially has a spin axis (also referred to as a spin) which is randomly polarized in the absence of the circularly-polarized pump light beam 18. This is schematically illustrated by the arrows in FIG. 3.

Figure 4:
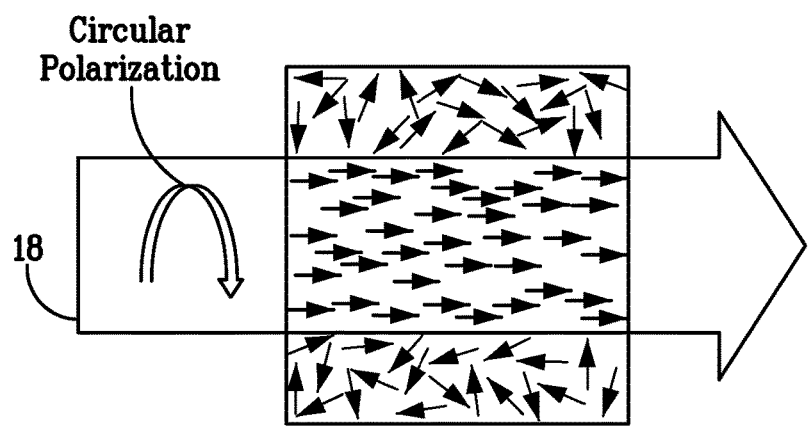
FIG. 4 schematically illustrates the magnetic polarization of the spins of the alkali metal atoms in the cell of the atomic magnetometer of FIG. 1 which is produced by optical pumping of certain of the alkali metal atoms using a circularly-polarized pump light beam.

The optical pumping of the alkali metal vapor 14 by the circularly-polarized pump light beam 18 re-orients the spins of the individual alkali metal atoms so that they are in a magnetically-polarized state with the spin of each alkali metal atom being aligned along the direction of the pump light beam 18 (i.e. along an optical axis defined by the pump light beam 18). This is indicated by the horizontal arrows in FIG. 4. The alkali metal atoms located outside of the pump light beam 18 remain randomly polarized as shown in FIG. 4.

The noble gas (e.g. helium or neon) which is provided in the buffer gas 16 in the cell 12 is useful to slow down the rate at which the atoms of the alkali metal vapor 14 collide with the inner walls of the cell 12 which can again randomize the spins of the alkali metal atoms. The noble gas can be, for example, at a pressure of about 60-100 kPa. The buffer gas 16 can also contain nitrogen which is useful to quench the $n^2P_{1/2}$ or $n^2P_{3/2}$ excited state resulting from pumping at the D1 or D2 line by the pump light beam 18 and thereby relax the metal vapor atoms back into the magnetically polarized $n^2S_{1/2}$ ground state at a more rapid rate. The nitrogen can be, for example, at a pressure of about 4 kPa. (As will be seen below, pure nitrogen can also be used as the buffer gas.)

Figure 5:
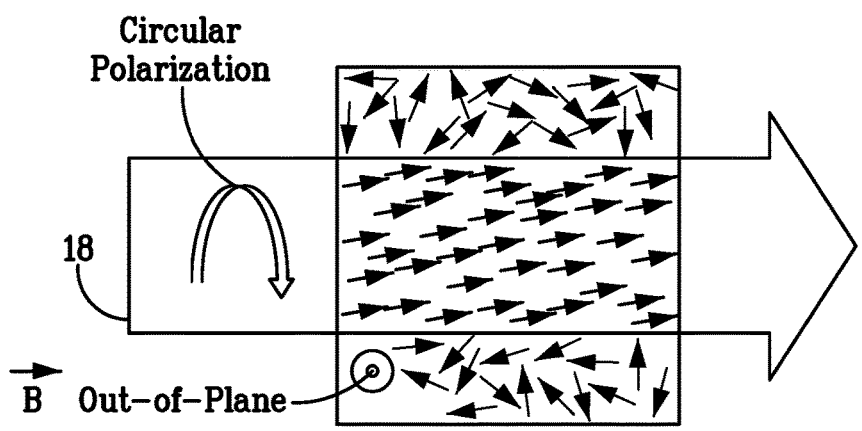
FIG. 5 schematically illustrates the rotation of the spins of the magnetically-polarized alkali metal atoms in FIG. 4 in the presence of a magnetic field B which is in a direction substantially orthogonal to the pump light beam.

In FIG. 5, a magnetic field B which passes through the cell 12 and is directed substantially orthogonally to the pump light beam 18 will interact with the magnetically-polarized alkali metal vapor 14 to generate a torque on the spins of the alkali metal atoms which have been magnetically polarized along the optical axis by the pump light beam 18. This torque due to the magnetic interaction with the alkali metal atoms causes the spins of the alkali metal atoms to be rotated at an angle with respect to the optical axis of the pump light beam 18 as shown in FIG. 5.

The exact angle of the spins of the alkali metal atoms relative to optical axis of the pump light beam 18 will depend upon the competing effects of optical pumping by the light beam 18, which polarizes the atomic spins, and magnetic spin precession, which causes the atomic spins to precess away from the optical axis at the Larmor frequency.

In FIGS. 1 and 5, the magnetic field B is shown as being substantially perpendicular to the plane of FIGS. 1 and 5 and is indicated by a circle with a dot therein. However, those skilled in the art will understand that the magnetic field B can be rotated about an optical path 34 of the pump light beam 18 at an arbitrary angle between 0° and 360° and still interact with the alkali metal vapor 14 so long as the magnetic field B or a component thereof is substantially orthogonal to the pump light beam 18.

The atomic magnetometer 10 detects the rotation of the alkali metal atoms in the vapor 14 by using a probe light beam 28 from another laser 30. The probe light beam 28 can have a wavelength which is substantially equal to the wavelength of the D2 line of the alkali metal vapor 14 when the pump light beam is at the wavelength of the D1 line, or alternately can have a wavelength which is substantially equal to the wavelength of the D1 line of the alkali metal vapor 14 when the pump light beam is at the wavelength of the D2 line. The optical power level of the probe light beam 28 can be up to a few milliwatts or more.

The lasers 20 and 30 used to generate the pump and probe light beams 18 and 28 can be, for example, distributed feedback (DFB) lasers or vertical-cavity surface emitting lasers (VCSELs). Those skilled in the art will understand that other types of lasers can be used to generate the pump and probe light beams 18 and 28, including other types of semiconductor lasers, titanium sapphire lasers and organic dye lasers.

In some cases, it may be possible to generate the pump and probe light beams 18 and 28, respectively, using a single laser. This can be done, for example, by using a multi-longitudinal-mode VCSEL or DFB laser having a longitudinal mode spacing which is substantially equal to a wavelength difference between the D1 and D2 lines of the alkali metal so that one longitudinal mode can be used to provide the pump light beam 18 and an adjacent longitudinal mode can be used to provide the probe light beam 28.

The probe light beam 28 can be made substantially collinear with the pump light beam 18. This can be done using an optical beam-combining element 32 which can be, for example, a beamsplitter, mirror, prism, diffraction grating, or optical fiber coupler. In the example of FIG. 1, a dichroic prism beamsplitter is shown.

The probe light beam 28 follows the optical path 34 of the pump light beam 18 through the linear polarizer 22, the lenses 24, the optical waveplate 26 and through the cell 12 containing the alkali metal vapor 14. At the wavelength of the probe light beam 28, the optical waveplate 26 functions as a full or half waveplate which rotates the linear polarization of the probe light beam 28 by an angle of 0 or 90° while maintaining the probe light beam 28 in a linear polarization state.

In order for the optical waveplate 26 to function both as a quarter-wave plate (i.e. for the pump light beam 18 and as a half-wave plate for the probe light beam 28, the optical waveplate 26 will generally be a high-order optical waveplate 26. As an example, when the alkali metal vapor 14 comprises rubidium, the high-order optical waveplate 26 can be made of crystalline quartz with a thickness 1.09 millimeters to provide an optical retardation of 12.25 waves at 795 nm (i.e. the D1 wavelength) for the pump light beam 18 and an optical retardation of 12.5 waves at 780 nm (i.e. the D2 wavelength) for the probe light beam 28. Those skilled in the art will understand that other types of birefringent materials can be used for the optical waveplate 26, and will also understand that the exact number of waves of optical retardation for the pump and probe light beams 18 and 28 will depend upon the alkali metal used to form the vapor 14.

Figure 6:
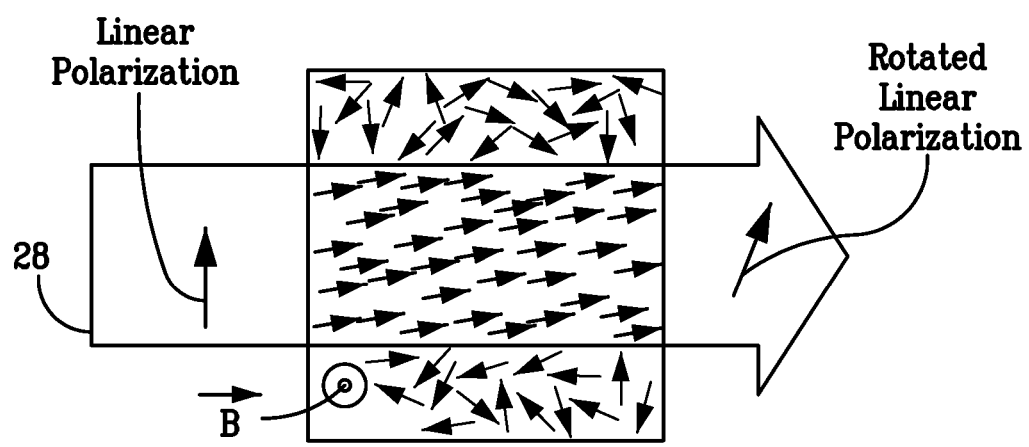
FIG. 6 schematically illustrates an angular rotation of the direction of linear polarization of the probe light beam which is results from the magnetically-polarized alkali metal atoms in the presence of the magnetic field B.

The probe light beam 28 passes through the cell 12 containing the alkali metal vapor 14, which has been magnetically-polarized by the pump light beam 18 to become birefringent. When probe light beam 28 passes through the polarized atomic vapor in cell 12, the linear polarization of the probe light beam 28 will be rotated over an angle which depends upon a magnitude (i.e. strength) of the magnetic field B. This is schematically illustrated in FIG. 6. By detecting the angular rotation of the linearly-polarized probe light beam 28, the atomic magnetometer 10 can be used to sense the magnetic field B.

An optical filter is provided in the atomic magnetometer 10 to separate the probe light beam 28 from the pump light beam 18 in preparation for detecting the angular rotation of the linearly-polarized probe light beam 28. The optical filter can comprise an optical interference filter 36 which transmits the probe light beam 28 while blocking the transmission of the pump light beam 18. Thus filter 36 exemplarily has a passband centered on the wavelength of the probe light beam 28.

The optical filter can also comprise a polarization beamsplitter 38 oriented at a 45° angle with respect to the polarization state of the probe light beam 28 in the absence of any magnetic field B. With this orientation, the polarization beamsplitter 38 splits the probe light beam 28 into two substantially equal beams 28' in the absence of any magnetic field B, thereby to enable a balanced detection of the probe light beams 28' using a pair of photodetectors 40.

Each photodetector 40, which can be, for example, a silicon photodetector or a III-V compound semiconductor photodetector, generates an electrical signal 42 which is proportional to an amount of the probe light beam 28' incident on that photodetector 40. The electrical signals 42 from the two photodetectors 40 in FIG. 1 are provided to a transimpedance amplifier 44 which differentially amplifies the electrical signals 42 from the photodetectors 40 to provide an output voltage signal 46. Any angular rotation of the linear polarization of the probe light beam 28 will result in a difference in intensity of the two beams 28' reaching the photodetectors 40. This will produce a change in the output voltage signal 46, thereby providing an indication of the magnitude of the magnetic field B sensed by the atomic magnetometer 10.

In the example of FIG. 1, residual magnetic fields (e.g. due to the earth's magnetic field, or due to nearby equipment or ac electrical wiring) can interfere with operation of the atomic magnetometer 10 and reduce its sensitivity. These residual magnetic fields can be substantially canceled out using one or more sets of coils 48 located about the cell 12 containing the alkali metal vapor 14. The coils 48 can be electrically activated, as needed, with an electrical current to cancel out the residual magnetic fields. These residual magnetic fields can also be reduced by locating the atomic magnetometer 10 within magnetic shielding (e.g. a magnetically-shielded enclosure or room) which can comprise one or more layers of a high-permeability material such as mu metal.

Phase sensitive detection of the output voltage signal 46 can be also used in the atomic magnetometer 10 of FIG. 1 to discriminate against background noise and unwanted residual magnetic fields. Such an approach can provide an improved sensitivity for detecting very small magnetic fields B such as bio-magnetic fields, which can have a magnetic field strength (i.e. intensity) on the order of a few hundred femtotesla or less.

Phase sensitive detection can be performed in the atomic magnetometer 10 by modulating the electrical current applied to one or more sets of the coils 48 at a reference frequency of up to a few kilohertz (kHz). This produces a modulated magnetic field component which can be used to synchronously detect a magnetic field B which is aligned with the modulated magnetic field component generated by the coils 48. This magnetic field component modulates the index of refraction of the alkali metal vapor 14 thus modulating the angular rotation of the linearly-polarized probe light beam 28 and producing a modulation at the reference frequency on the signals 42 and 46. This allows the use of a lock-in amplifier 50 to amplify the output voltage signal 46 at the reference frequency while filtering out noise and other unwanted signals which may be present in the signal 46 at other frequencies.

In this mode of operation, the atomic magnetometer 10 is sensitive to magnetic fields B that are perpendicular to the optical path 34 and parallel to the direction of the modulation of the magnetic field produced by the coils 48. Thus, by switching between different sets of the coils 48, the magnetometer 10 can detect magnetic fields B which are oriented in different directions substantially perpendicular to the optical path 34 (i.e. at different directions in a range of 0° to 360° around the optical path 34).

The capability of the atomic magnetometer 10 to sense magnetic fields B at any arbitrary angle which is substantially perpendicular to the common optical path 34 of the pump and probe light beams 18 and 28 provides an advantage over other types of atomic magnetometers that utilize a probe light beam which is orthogonal to the pump light beams. Due to the crossed arrangement of the pump and probe light beams in these other types of atomic magnetometers, these other types of magnetometers are restricted to measuring magnetic fields which are oriented in a single direction.

Figure 7:
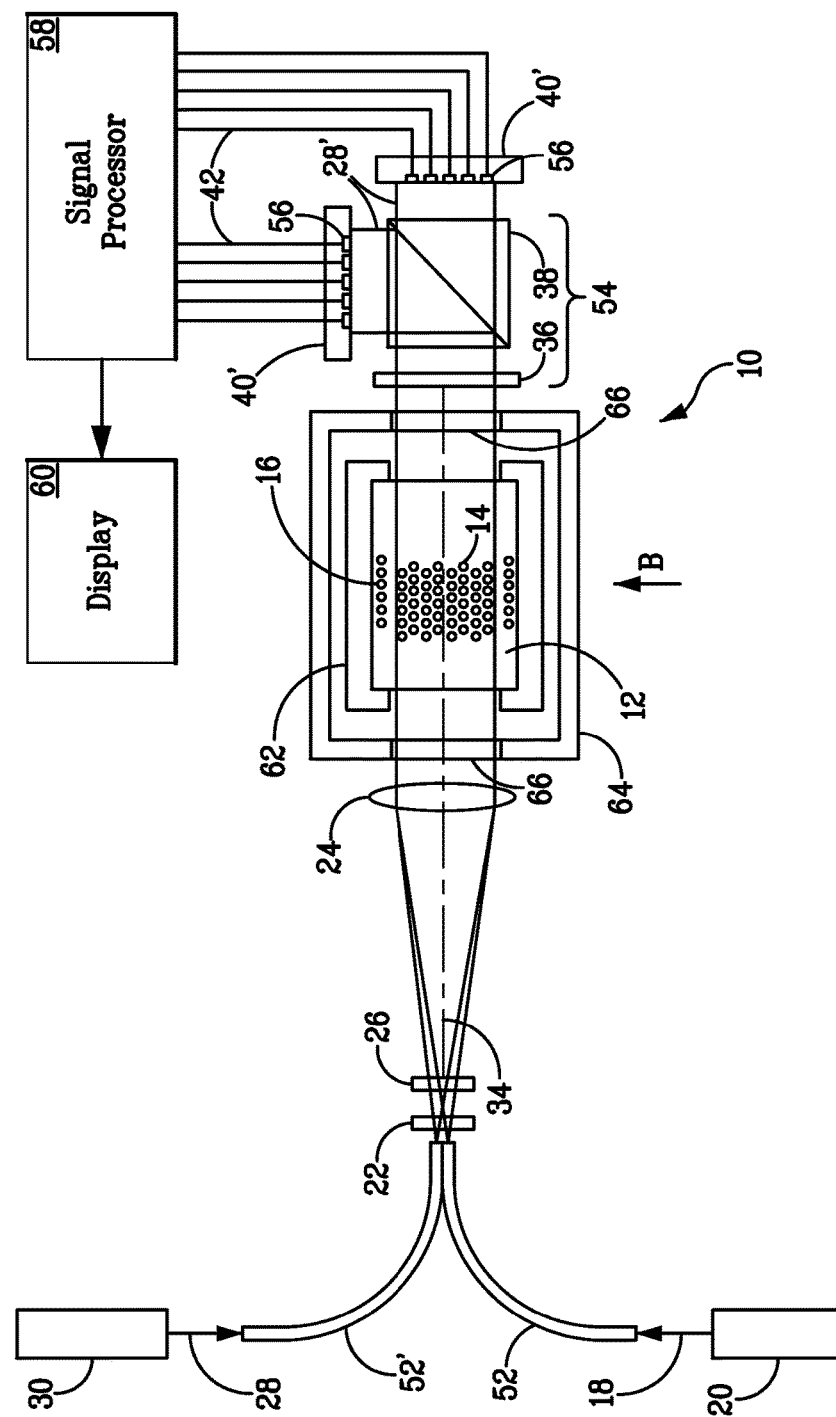
FIG. 7 shows a schematic diagram of a second example of an atomic magnetometer 10 of the prior art according to a description in the '556 patent.

FIG. 7 shows a schematic diagram of a second example of the atomic magnetometer 10 as also described in the '556 patent. In the apparatus 10 of FIG. 7, the pump light beam 18 is generated by a laser 20 and is coupled into an optical fiber 52; and the probe light beam 28 is generated by another laser 30 and is coupled into a different optical fiber 52'. The two optical fibers 52 and 52' can comprise single-mode optical fibers, multi-mode optical fibers or polarization-maintaining optical fibers. Exit ends of the two optical fibers 52 and 52' can be located adjacent to each other as shown in FIG. 7 so that the pump light beam 18 and the probe light beam 28 will overlap and become substantially collinear after they are emitted from the two optical fibers 52 and 52'.

In other embodiments of the present invention, the two optical fibers 52 and 52' can be connected together using an optical coupler (not shown) so that the pump and probe light beams 18 and 28, respectively, are combined and emitted out of a single optical fiber (e.g. the optical fiber 52 or 52', or a third optical fiber to which the optical fibers 52 and 52' are coupled).

A linear polarizer 22 can be placed proximate to the exit end of the optical fibers 52 and 52' to linearly polarize the pump and probe light beams 18 and 28, respectively, after these beams are emitted from the exit end of the fibers 52 and 52'. In some cases, the linear polarizer 22 can be omitted (e.g. when the optical fibers 52 and 52' are polarization-maintaining optical fibers).

The pump and probe light beams 18 and 28, which are diverging upon exiting the optical fibers 52 and 52', can be collimated using one or more lenses 24 prior to entry of the beams 18 and 28 into the cell 12 containing the alkali metal vapor 14. By locating the lens 24 or an assembly of lenses 24 at a predetermined distance from the exit end of the optical fibers 52 and 52', the divergence of the pump and probe light beams 18 and 28 after exiting from the optical fibers 52 and 52' can be used to expand these beams 18 and 28 up to the lateral dimensions of the cell 12. The lateral dimensions of the cell 12 can range from a few millimeters to a few tens of millimeters.

As shown in the figure, the vapor cell can be heated by an oven 62, and for thermal isolation the heated vapor cell can be enclosed within a thermally insulated, evacuated enclosure 64 having optical entry and exit windows 66.

Prior to entry into the cell 12 containing the alkali metal vapor 14, the pump light beam 18 is circularly polarized. The desired polarization is achieved by placing an optical waveplate 26 in an optical path 34 of the beam 18 either between the optical fiber 52 and the lens 24 as shown in FIG. 7, or alternately between the lens 24 and the cell 12 as shown in FIG. 1. The optical waveplate 26 can comprise a high-order optical waveplate as discussed previously with reference to FIG. 1, with the high-order optical waveplate functioning as a quarter waveplate at the wavelength of the pump light beam 18, and as a half waveplate at the wavelength of the probe light beam 28. This allows both the pump and probe light beams 18 and 28, respectively, to be transmitted through the same optical waveplate 26 and properly polarized.

The circularly polarized pump light beam 18 has a wavelength substantially equal to the wavelength of the D1 or D2 line of the particular alkali metal provided in the cell 12.

Transmission of pump light beam 18 through cell 12 containing alkali metal vapor 14 magnetically polarizes the alkali metal atoms so that the atomic spins are aligned along the direction of the pump light beam 18 (see FIG. 4). A magnetic field B, which in the case of FIG. 7 is shown parallel to the plane of FIG. 7 and substantially orthogonal to the optical path 34 of the pump light beam 18, then interacts with the magnetically-polarized alkali metal vapor 14 to generate a torque on the spins of the alkali metal atoms and thereby rotate the spins of the atoms at an angle with respect to the pump light beam 18 as previously described with reference to FIG. 5.

The effect of the magnetic field B on the magnetically polarized alkali metal vapor 14 is sensed using the probe light beam 28 which is directed through the cell 12 along substantially the same optical path 34 as the pump light beam 18, with the linear polarization of the probe light beam 28 being rotated about an angle which is dependent upon the magnitude of the magnetic field B (see FIG. 6). Upon exiting the cell 12, the pump light beam 18 is blocked by an optical filter 54 which comprises an optical interference filter 36. The optical filter 54 transmits the probe light beam 28 which then enters a polarization beamsplitter 38 which is considered herein to be a part of the optical filter 54. The polarization beamsplitter 38 then divides the probe light beam 28 into two substantially-equal beams 28' in the absence of any magnetic field B and directs these two beams 28' to separate photodetectors 40.

In the example of FIG. 7, each photodetector 40 comprises a multi-element photodetector 40' (also referred to as an array photodetector) having a one- or two-dimensional array of detector elements 56 formed, for example, from silicon or from a III-V compound semiconductor (e.g. gallium arsenide). Each individual detector element 56 acts as a separate photodetector to provide a spatially-resolved measurement of the magnetic field B sensed by the atomic magnetometer 10, thereby allowing the atomic magnetometer 10 to function as a magnetic gradiometer. In operating magnetometer 10 as a gradiometer, common-mode magnetic fields can effectively be cancelled out through a gradiometric subtraction of the signals 42 or 46 from adjacent detector elements 56 of each multi-element photodetector 40', thereby increasing the sensitivity and selectivity for measuring magnetic field gradients.

The use of multi-element photodetectors 40' in the apparatus 10 of FIG. 7 can also provide a higher resolution for sensing the magnetic field B than is possible with a single-element photodetector 40. This is because each individual detector element 56 in the multi-element photodetectors 40' can view a different part of the probe light beam 28 and thereby sense the magnetic field B in a different part of the alkali metal vapor 14. Those skilled in the art will understand that each example of the atomic magnetometer 10 of the present invention described herein can be implemented with multi-element photodetectors 40'.

In the example of FIG. 7, an electrical signal 42 can be generated from each detector element 56 and provided to a signal processor 58 which is used to process the various electrical signals 42. The electrical signals 42 from each multi-element photodetector 40' can be output in series or in parallel as shown in FIG. 7.

The signal processor 58 can comprise a plurality of transimpedance amplifiers 44 (see FIG. 1), with each amplifier 44 receiving and differencing the electrical signals 42 from a detector element 56 in each of the two multi-element photodetectors 40' which detects the same part of the probe light beam 28 to provide an output voltage signal 46 which is nulled in the absence of any magnetic field B. When the electrical signals 42 are modulated by one or more sets of coils 48 to provide a reduced noise level and an enhanced detection sensitivity as previously described with reference to FIG. 1, the signal processor 58 can comprise a plurality of lock-in amplifiers 50 to synchronously detect the output voltage signals 46. Additionally, the signal processor 58 can include a computer to digitize and store information which can be used to determine the magnitude and direction of the magnetic field B so as, for example, to determine gradients in the magnetic field B. This information about the magnetic field B can then be presented on a display 60 connected to the signal processor 58.

In some implementations, spatial resolution will be provided in the magnetometer by four-quadrant photodetectors. Typically, a pair of such photodetectors will be provided, each receiving a respective one of the two light beams 28' into which the probe beam is divided by polarization beamsplitter 38. For gradiometric measurements, a baseline is provided by the separation between the respective centers of measurement of the quadrants within each photodetector. When measuring very small field gradients, it is desirable to have a relatively large baseline, as this increases the sensitivity of the instrument to field gradients.

The concept of "center of measurement" is useful for specifying the spatial location within a vapor cell where the magnetic field measurement is being made. As will be understood, the probe laser beam passes through the vapor cell and is then imaged onto the photodetector, which may have multiple detector elements. The center of measurement for a given photodetector element is found by taking a weighted integral of the lateral position coordinates $(r, \theta)$ in a cross section of the laser beam, more specifically a cross section of a portion of the laser beam, taken within the vapor cell, that impinges on the pertinent photodetector element. The weighting factor is the product $I_{pump} \cdot I_{probe}$ of the pump and probe laser-beam intensities $I_{pump}$ and $I_{probe}$, respectively. The center-of-measurement calculation is in that sense similar to a center-of-mass calculation for a thin disk, except that $I_{pump} \cdot I_{probe}$ takes the place of the areal mass density $\sigma$.

Figure 8:
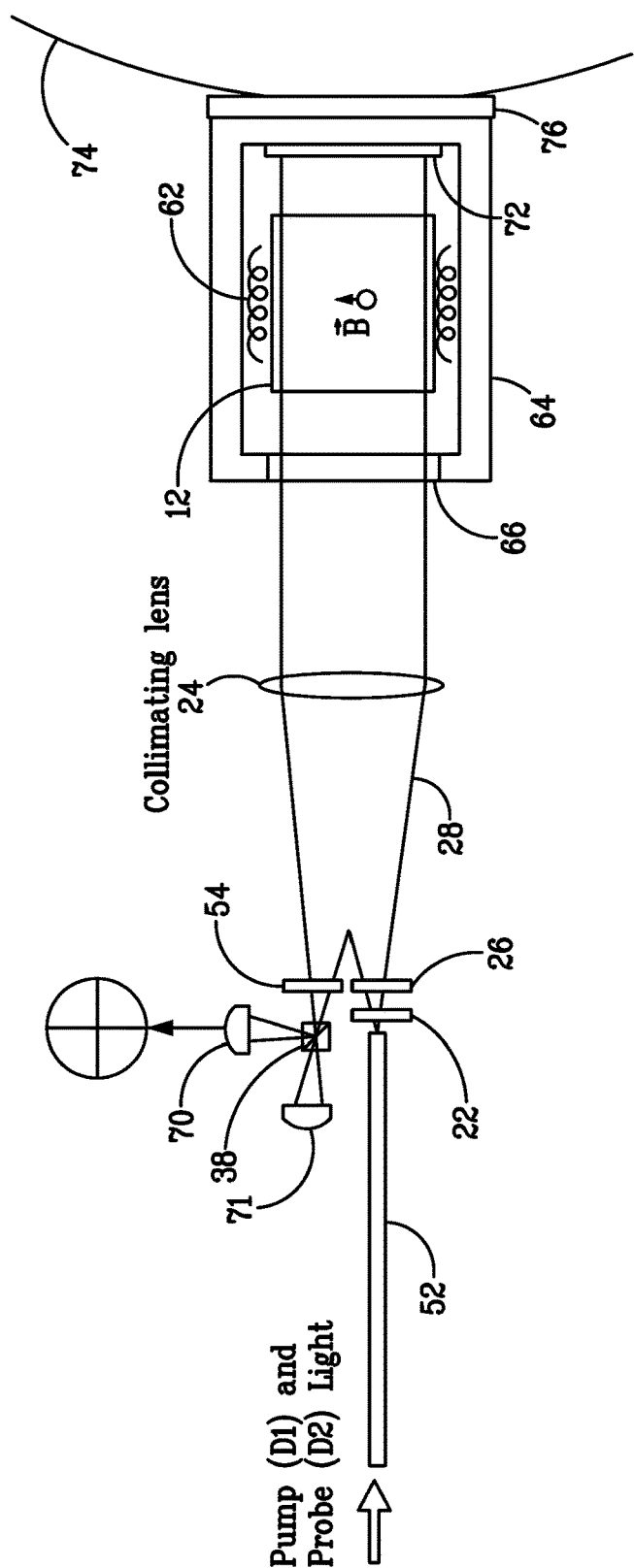
FIG. 8 is a schematic view of a magnetometer similar to the magnetometer of FIG. 1, but including an optical detection system that includes a pair of four-quadrant photodetectors. Also represented in FIG. 8 is an oven for heating the atomic vapor, which in the illustrated example is a vapor of rubidium. It is apparent in the figure that the magnetometer is being used for magnetoencephalography (MEG) of a human subject whose head is separated from the vapor cell by a vacuum gap of 1 cm. The patient is protected from the elevated temperature within the vapor cell by the vacuum gap and by insulative walls of the vapor cell enclosure.

FIG. 8 is a schematic view of a magnetometer similar to the magnetometer of FIG. 1, but including an optical detection system that includes a pair of four-quadrant photodetectors 70, 71 as described above. FIGS. 7 and 8 contain several corresponding elements, which are designated by like reference numerals.

The magnetometer of FIG. 8 also employs a folded optical geometry in which a mirror 72 reflects the probe beam on a second pass back through the vapor cell and (in the example shown) back through the collimating lens. As in the preceding figures, the magnetometer illustrated is a single-beam magnetometer, because only a single probe beam passes through the vapor cell.

Also represented in FIG. 8 is an oven 62 for heating an atomic vapor of, e.g., rubidium. The figure shows the magnetometer in use for magnetoencephalography (MEG) of a human subject whose head 74 is separated from the vapor cell by a vacuum gap 76 of, e.g., 1 cm. The patient is protected from the elevated temperature within the vapor cell by the vacuum gap and by insulative walls of the vapor cell enclosure.

In a prototype of the magnetometer design of FIG. 8, we passed a single probe beam through a round vapor cell 20 mm in diameter and 1 cm in length, filled with a buffer gas mixture of 600 Torr helium, 30 Torr nitrogen. In that prototype, there was a separation of about 5 mm between the magnetometer channels, i.e. between the respective centers of measurement.

Figure 9:
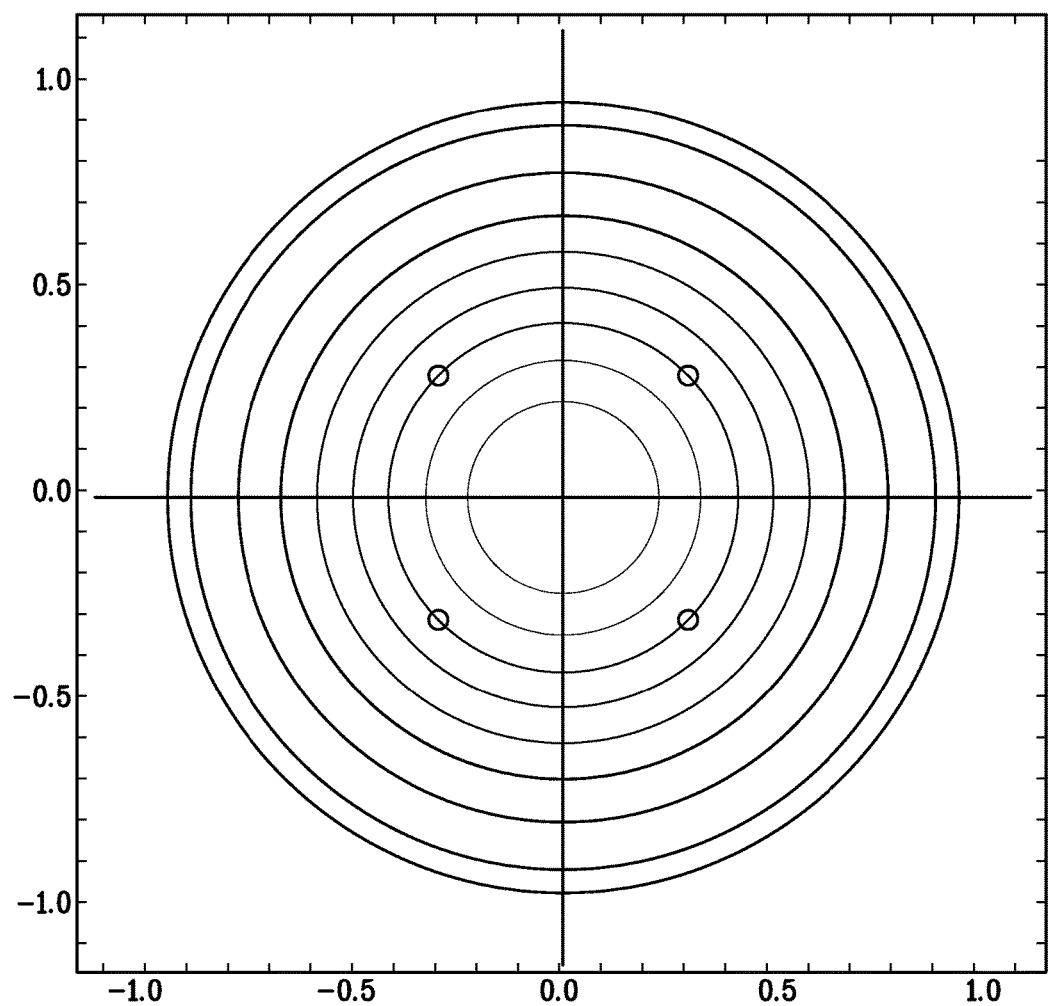
FIG. 9 provides a graph illustrating the beam profile of the single beam magnetometer of FIG. 8 as it passes through the vapor cell. The four dots arranged at the corners of a quadrilateral show the respective centers of measurement for each of the four quadrants. The perpendicular gridlines that intersect at the center of the figure are provided to illustrate how the four-quadrant photodiode sections the beam.

FIG. 9 provides a graph illustrating the beam profile of the single beam magnetometer of FIG. 8 as it passes through the vapor cell. The four dots arranged at the corners of a quadrilateral show the respective centers of measurement for each of the four quadrants. The perpendicular gridlines that intersect at the center of the figure are provided to illustrate how the four-quadrant photodiode sections the beam.

We discovered that our prototype posed several challenges. For example, we found it difficult to ensure that the four-quadrant photodiode on one output of the PBS was dividing the beam in the same way as its counterpart photodiode on the other PBS output. We also found a challenge posed by the Gaussian beam profile of the laser beam, which was brightest near its center and had a $1/e^2$ diameter of 20 mm. The resulting placement of the respective centers of measurement yielded, in experimental trials, a spatial channel separation of only 4-5 mm. Although an instrument having such characteristics will be useful, there are important applications, particularly in medicine, that call for greater channel separations that afford greater sensitivity.

In the design described above with reference to FIG. 8, a single large beam was sent into the alkali vapor cell and then upon detection, the beam was detected on a pair of four-quadrant photodiodes to detect the spatial variation in the magnetic field across the vapor cell. We have made an improvement that can increase the separation between individual channels in a single vapor cell. The improvement is described below.

Magnetometer Design Using a Diffractive Optical Element

In a new design approach, a plurality of spatially separated laser beams, for example four such beams, pass through respective portions of the vapor cell. A single master beam (typically including both pump and probe components) is broken into the spatially separated beams by a diffractive optical element (DOE), exemplarily a two-dimensional diffraction grating. Because each center of measurement can now be aligned with the center of a respective probe beam, substantially greater channel separations can be achieved. By way of example, we have achieved a channel separation of about 18 mm in a square vapor cell of 25-mm side length. One of the advantages this provides is a larger baseline for gradiometric measurements.

Figure 10:
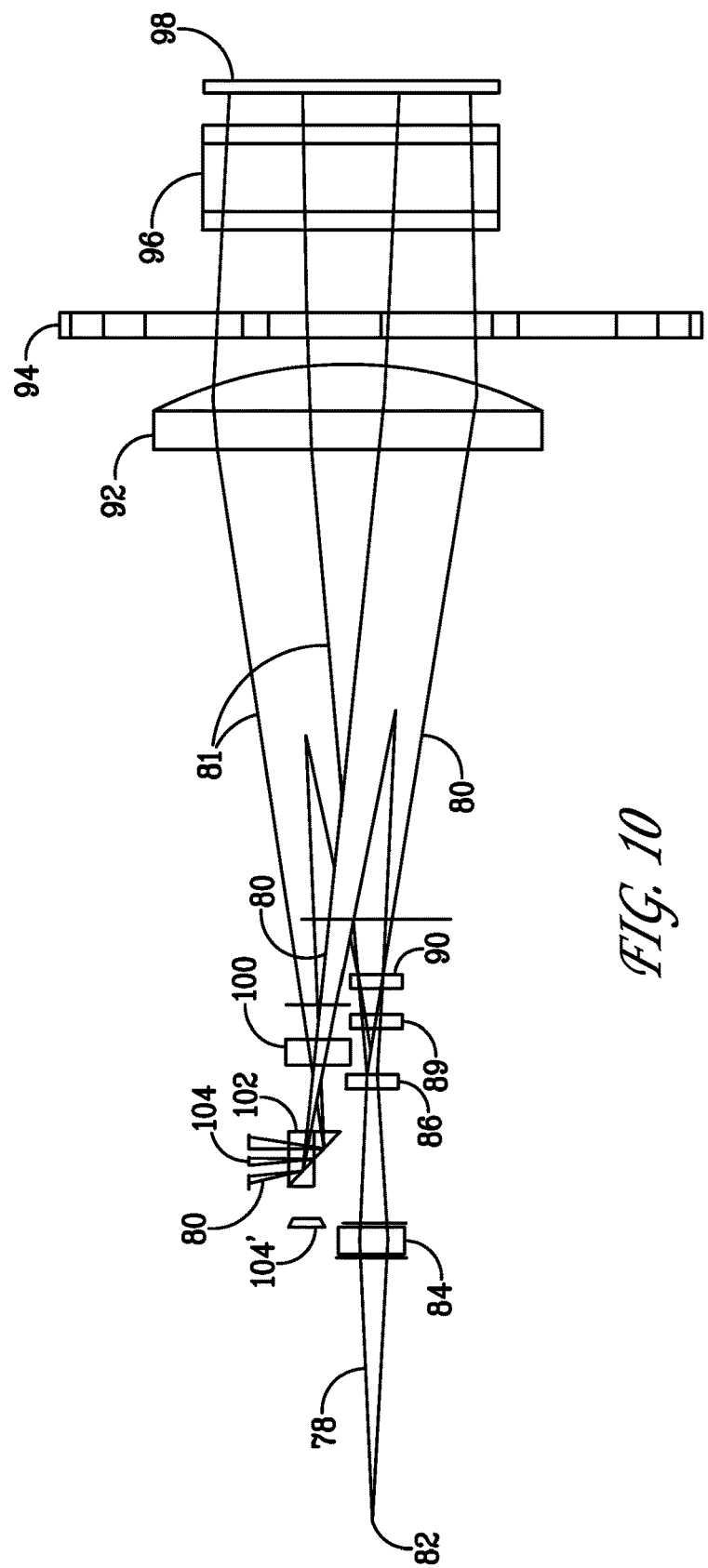
FIG. 10 is an optical diagram illustrating the use of a diffractive optical element (DOE) according to an illustrative embodiment of the present invention.

FIG. 10 is an optical diagram illustrating the use of a DOE according to our new design approach. The master probe beam 78 is shown in the figure together with two of the individual, spatially separated probe beams 80, 81 downstream of the DOE. Also indicated in the figure are the point 82 where the pump and probe beams emerge from the end of a polarization-maintaining optical fiber (not shown in the figure), a lens 84, the DOE 86, a polarizer 88 followed by a half-wave plate 90, a converging or collimating lens 92, a window 94, the vapor cell 96, the mirror 98 placed behind the vapor cell to fold the optical path, a band-rejection filter 100 for excluding the pump beam from the light that is to be detected, a cube beam splitter 102 for separating the cluster of output probe beams into two sub-clusters of respective polarizations, and a pair of four-quadrant photodetectors 104, 104'. For clarity, only one of the two photodetectors is shown being impinged by a cluster of output probe beams.

Figure 11:
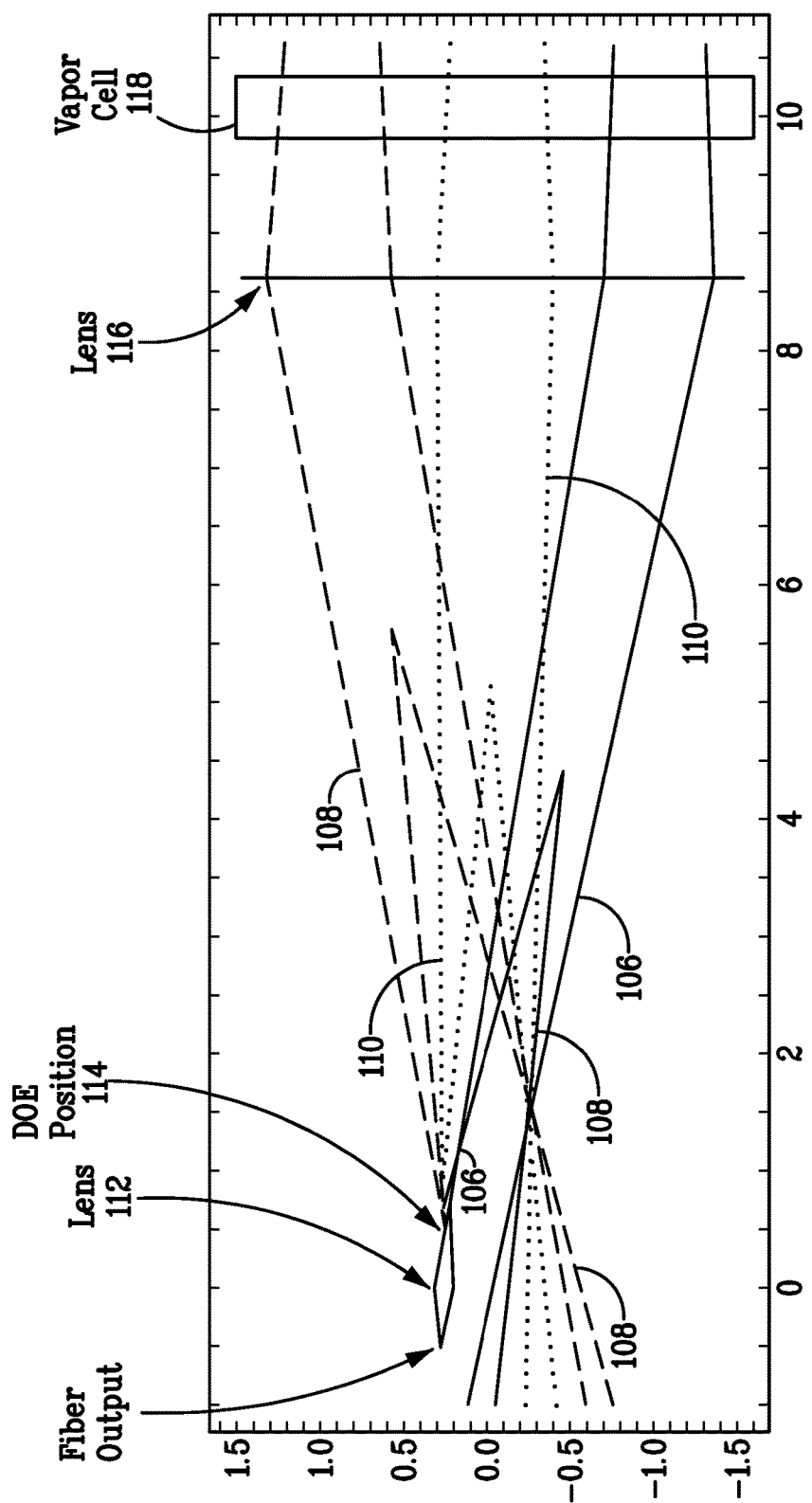
FIG. 11 provides a ray trace showing two of four beams generated by a DOE according to an illustrative embodiment of the present invention. The desired beams are represented (after the DOE) by bundles of rays respectively drawn with solid and broken lines. A zero-order beam, represented by dotted lines, can be suppressed by appropriately designing the DOE. As shown in the figure, a first lens focuses the optical fiber output onto the DOE, and a second lens refocuses each of the diverging beams from the DOE. The beams are retroreflected from the back of the vapor cell and again refocused on the exit path to the optical filter and photodetection system.

FIG. 11 illustrates another aspect of the magnetometer of FIG. 10. FIG. 11 is a ray-tracing diagram that shows two beams 106, 108 of a total of four beams generated by the DOE. The desired beams are represented (downstream of the DOE) by bundles of rays respectively drawn with solid and broken lines. A zero-order beam 110, represented by dotted lines, can be suppressed by appropriately designing the DOE. As shown in the figure, the lens at position 112 focuses the optical fiber output onto the DOE at position 114, and a second lens (which in this example is a converging lens) at position 116 refocuses each of the diverging beams from the DOE. The beams are reflected from the back of the vapor cell 118 and again refocused on the exit path to the optical filter and photodetection system.

As illustrated in FIG. 11, the DOE generates beams that diverge from each other in a square arrangement so that when they arrive at the vapor cell they are well separated. The beams are also well separated at the detector, so that it will be straightforward to align the detectors to the beams downstream of the polarization beam splitter (PBS). It should be noted in this regard that the DOE can be designed, within physical and practical limits, to produce an arbitrary divergence angle between the beams. As a consequence, the distance between the beams where they traverse the sensing volume can be established in at least some designs by setting the distance between the sensing volume and the DOE. This provides one strategy for achieving arbitrary magnetometer channel spacing.

Figure 12:
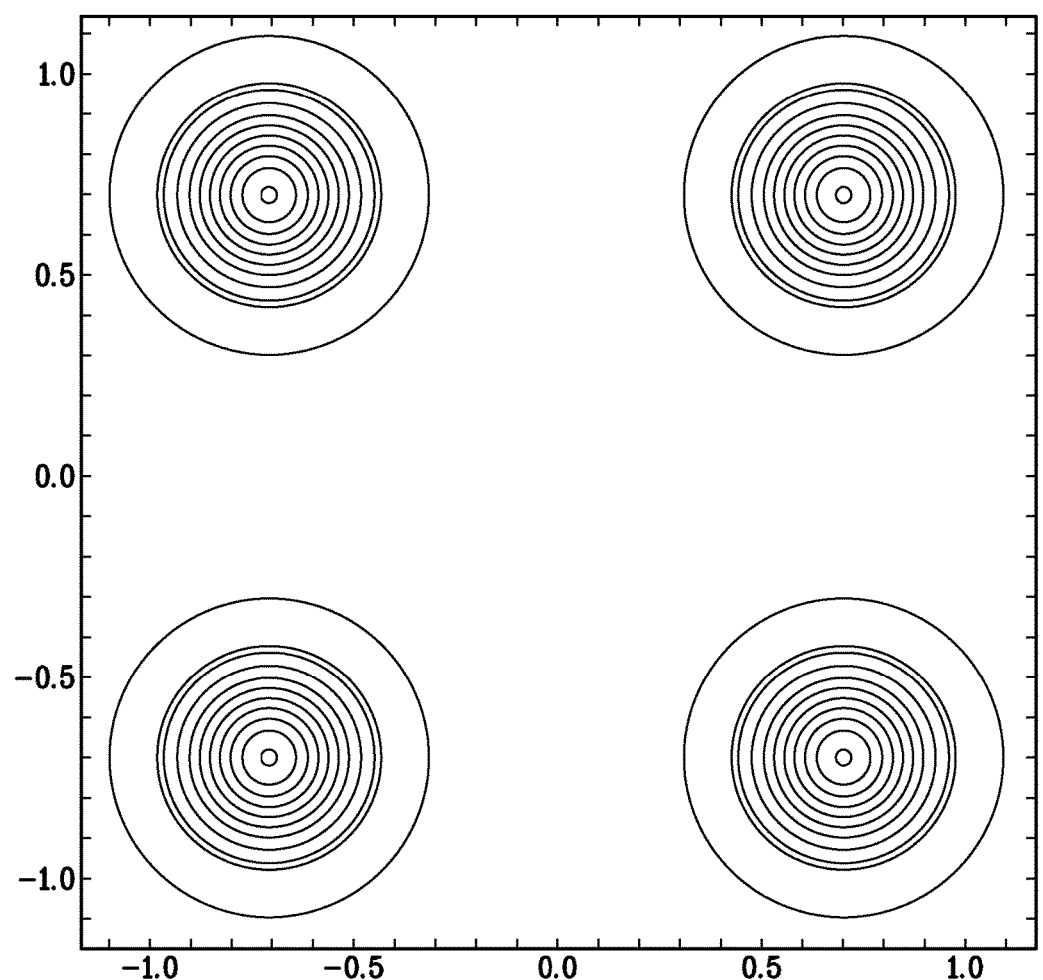
FIG. 12 provides a graph illustrating the beam profile of the four beams within the vapor cell that are generated by a diffractive optical element (DOE) according to an illustrative embodiment of the present invention. The four bulls-eye dots are provided to illustrate that each center of measurement is at the center of a respective, individual beam.

FIG. 12 provides a graph illustrating the beam profile of the four beams within the vapor cell that are generated by the DOE. The four bulls-eye dots are provided to illustrate that each center of measurement is at the center of a respective, individual beam.

The DOE that we used in a practical implementation of the present invention was purchased as a commercial product from Holoeye Photonics AG of Berlin-Adlershof, Germany, having a sales office at Holoeye corporation, 1620 Fifth Avenue, Suite 550, San Diego, Calif. 92101, and contactable for general inquiries at contact@holoeye.com and for sales inquiries at sales@holoeye.com. Holoeye offers various DOE structures that are embossed into a thin polymer film on a glass substrate. Various dot line and two-dimensional dot matrix diffraction patterns are available.

The principles described here are readily extended to pluralities of more than four beams that impinge larger 2D arrays of photodetector elements such as 3×3 or 4×4 arrays, even greater arrays. Also, a 1D array in any of a great range of sizes is readily made to cooperate with a corresponding DOE to make a line of photodetector elements.

In practical implementations, we believe it will be possible to design our atomic magnetometer (AM) sensor head to fit within an envelope of cross section 4 cm×4 cm. We also believe it will be possible to design the sensor so that the magnetic sensing region can approach within 9 mm, or even less, of a body part of a living subject such as a patient's head.

An exemplary design has a rubidium vapor cell that has a one-way optical path length of 4 mm, has an overall length and width of 25 mm, and is filled with pure nitrogen at a pressure of 600 Torr. The $1/e^2$ beam diameter is about 2 mm. Our studies have shown that such a cell can operate over a bandwidth of about 100 Hz and can provide sensitivity better than 10 fT/Hz$^{1/2}$ over a frequency range of 5-100 Hz.

In operation, our AM vapor cell is maintained at an elevated temperature, e.g. a temperature of 150° C. It is therefore advantageous to provide a capability to locally air cool (or even water cool) the sensor module using fluid channels that are built into the chassis of the module. In this way, it is possible to maintain the exterior of the module at ambient temperatures to ensure the comfort and safety of human subjects.

A practical implementation of the sensor described in the '556 patent included various mechanical components that were machined from fiberglass. This was believed desirable to avoid generating Johnson noise from eddy currents that could arise in any significant concentration of metal placed near the magnetometer. However, we have since found that rapid prototyping ("3D printing") technology is a viable alternative fabrication technology that can achieve satisfactory results at lower cost and that is less restrictive as to possible design choices. Accordingly, we believe that 3D printing will be used to good advantage in the fabrication of non-metallic mechanical components of a sensor system designed according to the principles described here.

For more precise localization of magnetic sources within a sample, multiple sensor modules (or "magnetometer heads"), each including a vapor cell and a photodetector array, can be deployed in an array adjacent to or surrounding the volume into which a sample can be introduced. Each sensor module can include its own pump and probe lasers, or in alternative arrangements the pump and probe light from a master light source can be distributed to each of the magnetometer heads.

Figure 13:
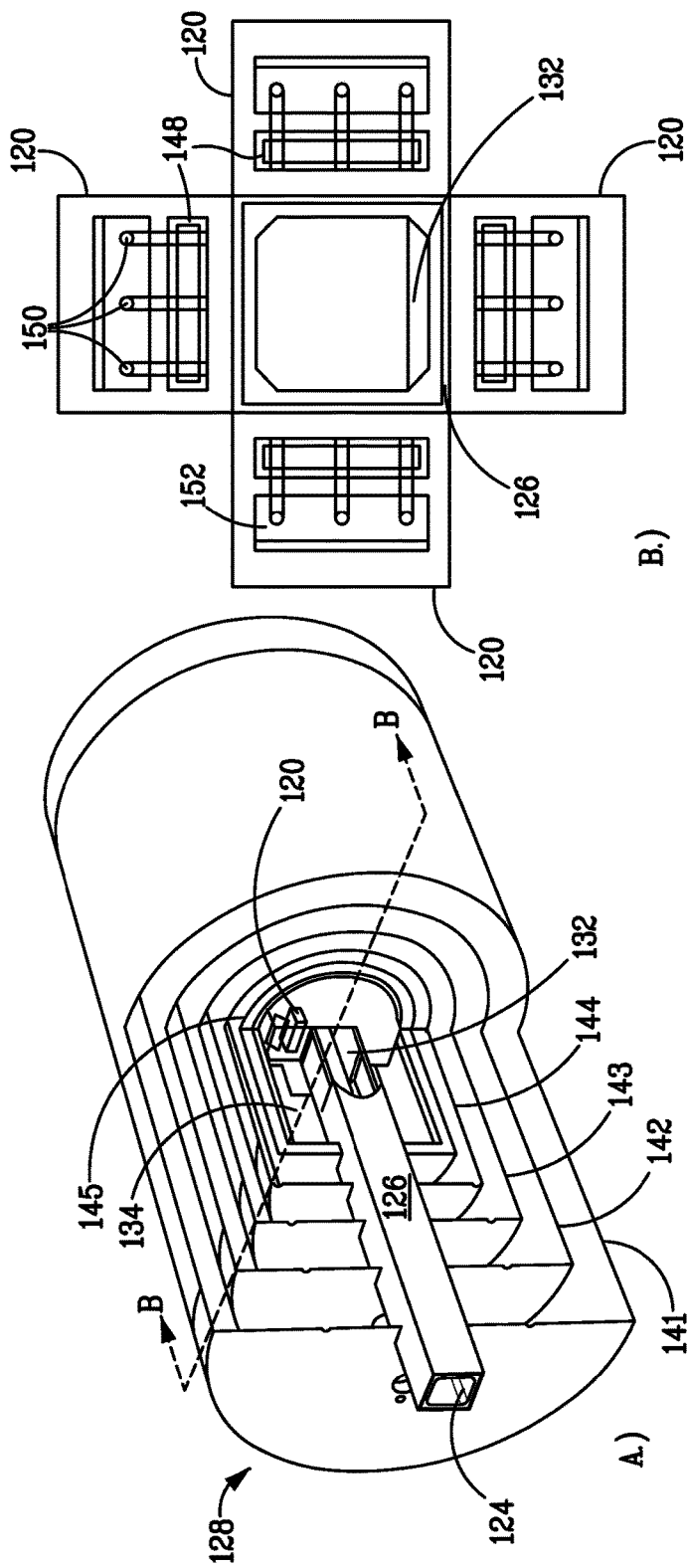
FIG. 13 provides a cross-sectional view of a magnetic imaging device according to an embodiment of the present invention.

For example, FIG. 13 shows an array of four sensor modules 120 placed in a square or other rectangular arrangement about a sample tube 124 wrapped by a solenoid 126 and contained within a magnetic shield 128. The sample (not shown in the figure) is positioned by a moveable arm (not shown) that is advanced to move a sample carrier 132 in precise increments along the sample tube. Also indicated in the figure are the field coils 134 used to modulate the magnetic field.

The efficacy of the magnetic shield 128 is an important factor in determining the ultimate sensitivity of a system such as that illustrated in FIG. 13. By careful design of the magnetic shielding, we were able to achieve, in a prototype, a magnetometer sensitivity of 7 fT/Hz$^{1/2}$. This was achieved with four concentric layers 141-144 of mu-metal shielding, augmented by an inner layer 145 of ferrite shielding. Ferrite is advantageous because it has less thermal noise than mu-metal over at least some frequencies of interest for biomedical applications, and also because as an electrical insulator it is free of eddy currents that would otherwise be produced when the solenoid field is switched.

With further reference to FIG. 13, it will be seen that the vapor cell 148 within each of the four magnetometer heads 120 is traversed by three laser beams 150 which will ultimately impinge on respective photodetector elements (not shown) after back-reflection by mirrors 152 and a second pass through their respective vapor cells. Thus, the system shown in the figure provides a total of twelve spatial channels for detection. Extensions to a greater number of channels per magnetometer head, and to a greater number of magnetometer heads per array are of course possible and contemplated as within the scope of the present invention.

An important aspect of the system of FIG. 13 is that the sample tube is contained within the solenoid coil. The field produced by a solenoid is (ideally) confined entirely within the interior of the solenoid. Hence, the sample can be subjected to a magnetic field that is not experienced by the magnetometer. Thus a large field can be applied to the sample while the magnetometers (or of course a plurality of magnetometers) can be held near zero field as is required for their operation. For example, the solenoid may be energized by a pulsed power source to produce a large transient field, local to the sample, for initiating a relaxation process that is then observed dynamically.

We claim:
1. Atomic magnetometer apparatus, comprising:
an atomic vapor cell;
an optical system conformed to transmit radiation comprising pump light through the vapor cell; and
an optical detection system arranged to receive and detect at least a portion of the transmitted radiation after it exits the vapor cell;
wherein:
the optical system comprises a diffractive optical element arranged to divide at least a portion of the transmitted radiation into a plurality of separate diffracted beams that traverse the vapor cell;
the diffractive optical element is conformed to divide radiation incident thereon into at least four separate beams that traverse the vapor cell;
the optical system is arranged such that each of the separate diffracted beams that traverse the vapor cell contains radiation at both a pump wavelength and a probe wavelength that is different from the pump wavelength; and
the optical detection system comprises at least one array of photodetector elements, in which each element is arranged to detect a corresponding one of the separate diffracted beams that traverse the vapor cell.

2. The atomic magnetometer apparatus of claim 1, wherein the optical system comprises a laser for transmitting a pump beam through the vapor cell and a laser for transmitting a probe beam through the vapor cell.

3. The atomic magnetometer apparatus of claim 1, wherein the optical detection system is arranged to measure optical rotation of probe light that has been transmitted through the vapor cell.

4. The atomic magnetometer apparatus of claim 1, wherein the optical detection system is arranged to measure an amount of pump light that has been transmitted through the vapor cell.

5. The atomic magnetometer apparatus of claim 1, wherein the array of photodetector elements is a two-dimensional array and the apparatus further comprises electrical circuitry conformed to calculate magnetic gradient measurements from voltages output by the photodetector elements of the array.

6. The atomic magnetometer apparatus of claim 1, wherein:
the optical detection system is a differential detection system in which each of the separate diffracted beams that traverse the vapor cell is split into two sub-beams by a polarization beam splitter after exiting the vapor cell, thereby to split the plurality of separate diffracted beams into a first plurality of sub-beams having a first polarization and a second plurality of sub-beams having a second polarization;
the optical detection system comprises: a first array of photodetector elements that is impinged by the first plurality of sub-beams; and a second array of photodetector elements that is impinged by the second plurality of sub-beams;
each photodetector element of said first array is arranged to detect a corresponding one of the sub-beams of the first said plurality of sub-beams; and
each photodetector element of said second array is arranged to detect a corresponding one of the sub-beams of the second said plurality of sub-beams.

7. Atomic magnetometer apparatus, comprising:
an atomic vapor cell;
an optical system conformed to transmit radiation comprising pump light through the vapor cell; and an optical detection system arranged to receive and detect at least a portion of the transmitted radiation after it exits the vapor cell;

wherein the optical system comprises a diffractive optical element arranged to divide at least a portion of the transmitted radiation into a plurality of separate diffracted beams that traverse the vapor cell;

and wherein the atomic magnetometer apparatus further comprises:

a solenoid coil;

a sample tube, positioned within the solenoid coil, for containing a sample to be subjected to magnetic imaging; and at least one further atomic vapor cell; wherein:

the atomic vapor cells are positioned within a magnetic sensing distance of the sample tube;

each atomic vapor cell is arranged to be transilluminated by radiation comprising pump light from an optical system; and each atomic vapor cell is arranged to pass the transilluminating radiation, after it exits the atomic vapor cell, to an optical detection system arranged to receive and detect at least a portion of the passed radiation.

8. The atomic magnetometer apparatus of claim 7, comprising a plurality of sensor modules positioned within a magnetic sensing distance of the sample tube, wherein each sensor module includes one or more atomic vapor cells and one or more optical detection systems.

9. The atomic magnetometer apparatus of claim 8, each sensor module further comprises a respective optical system.

10. The atomic magnetometer apparatus of claim 7, further comprising a pulsed power source for driving the solenoid coil so as to produce a transient magnetic field within the sample tube.

11. The magnetic imaging system of claim 7, further comprising a mechanical arrangement for moving the sample longitudinally along the sample tube.

\* \* \* \* \*